United States Patent [19]
Kameda et al.

[11] Patent Number: 5,195,577
[45] Date of Patent: Mar. 23, 1993

[54] COOLING DEVICE FOR POWER SEMICONDUCTOR SWITCHING ELEMENTS

[75] Inventors: Takashi Kameda; Nobuyoshi Takahashi; Takeo Yoshioka; Kenichi Mori; Masahiro Ashiya, all of Amagasaki, Japan

[73] Assignee: Mitsubishi Denki Kabushiki Kaisha, Tokyo, Japan

[21] Appl. No.: 602,866

[22] Filed: Oct. 24, 1990

[30] Foreign Application Priority Data

| Oct. 26, 1989 | [JP] | Japan | 1-124570 |
| Oct. 31, 1989 | [JP] | Japan | 1-126565 |
| Feb. 5, 1990 | [JP] | Japan | 2-24438 |
| Mar. 7, 1990 | [JP] | Japan | 2-56836 |
| Apr. 20, 1990 | [JP] | Japan | 2-106011 |
| Jul. 19, 1990 | [JP] | Japan | 2-189602 |

[51] Int. Cl.$^5$ ............... F28D 15/02; H01L 23/427
[52] U.S. Cl. ............... 165/104.13; 165/104.33; 165/108; 361/385
[58] Field of Search ......... 165/104.25, 104.13, 165/104.33, 108; 123/41.21, 41.42, 41.44; 361/385

[56] References Cited

U.S. PATENT DOCUMENTS

| 1,701,615 | 2/1929 | Grantier | 165/104.25 |
| 1,787,562 | 1/1931 | Barlow | 123/41.21 |
| 1,792,520 | 2/1931 | Weinhardt | 123/41.21 |
| 2,110,774 | 3/1938 | Privett | 165/104.25 |
| 3,255,813 | 6/1966 | Besson et al. | 165/104.25 |
| 3,561,229 | 2/1971 | Levin | 165/104.25 |
| 3,609,991 | 10/1971 | Chu et al. | 62/333 |
| 4,293,030 | 10/1981 | Rambach . | |

FOREIGN PATENT DOCUMENTS

| 0002610 | 6/1979 | European Pat. Off. . | |
| 3417986 | 11/1985 | Fed. Rep. of Germany . | |
| 2200488 | 9/1973 | France | 165/104.33 |
| 122153 | 9/1981 | Japan . | |

OTHER PUBLICATIONS

Kobayashi et al., "Development of High Power Semiconductor Equipment by Means of Boiling and Condensing Heat Transfer", Mitsubishi Electric Corporation Technical Journal, vol. 48, No. 2, Feb. 1974, pp. 229–239.

Jacquelin et al., "Refroidissement de Systems Electroniques de Puissanace", Sep. 1989, pp. 38–47.

Primary Examiner—Albert W. Davis, Jr.
Attorney, Agent, or Firm—Leydig, Voit & Mayer

[57] ABSTRACT

A boiling type cooling device for cooling power semiconductors includes an evaporator containing an aqueous solution of ethylene glycol as a cooling medium, a condenser; and a vapor and liquid return pipe. According to a first aspect, the lowest portion of the condensor is at a level higher than the top surface of the cooling medium in the evaporator, the bottom surfaces of the condensor being tilted downward toward the top end of the liquid return pipe. According to another aspect, a pump is provided in the liquid return pipe for driving cooling medium to the evaporator. According to still other aspects, the liquid return pipe is covered with a heat insulating material, or a rubber string extends centrally therewithin. A deaeration device for the aqueous solution of ethylene glycol includes two separate deaeration baths and a mixing bath.

4 Claims, 15 Drawing Sheets

COOLING DEVICE FOR POWER SEMICONDUCTOR SWITCHING ELEMENTS

BACKGROUND OF THE INVENTION

This invention relates to boiling and condensing heat transfer type cooling devices, and more particularly to such boiling type cooling devices for cooling power semiconductor switching elements of inverters and choppers, etc., of electric components mounted on railroad vehicles.

FIG. 1 is a sectional view of a conventional boiling and condensing heat transfer type cooling device (hereinafter referred to as a boiling type cooling device or simple as a boiling cooling device) for cooling thyristors, which is disclosed, in Mitsubishi Denki Giho (Mitsubish Electric Corporation's Techinical Journal), Vol. 48, No. 2, 1974, p. 231.

In FIG. 1, flat thyristor elements 1 coupled to fins 2 in pressured contact therewith are accomodated within an evaporator 3 containing a liquid fluorocarbon 4. A condenser 5 is disposed above the evaporator 3 such that the fluorocarbon vapor 4a generated within the evaporator 3 is introduced via a vapor conduit pipe 6 to the condenser 5. A liquid return conduit pipe 7 carries to the evaporator 3 the liquid fluorocarbon 4 condensed from the fluorocarbon vapor 4a within the condenser 5.

The operation of the device of FIG. 1 is as follows. When the thyristors 3 are in operation, the electrical power loss taking place therein results in the generation of an amount of heat as large as several hundred watts. The heat thus generated is transferred to the fluorocarbon 4 via the fins 2 in pressured contact with the cooled surfaces of the thyristors elements 1. The flux of heat flowing through the fins 2 reaches as high a value as $10^5$ W/m$^2$. As a result, the fluorocarbon 4 boils, and the thyristors elements 1 are cooled by means of the so-called boiling fluorocarbon cooling. The fluorocarbon vapor 4a generated within the evaporator 3 by the boiling of the fluorocarbon proceeds via the vapor pipe 6 into the condenser 5 to be cooled and condensed therein by means of an exterior cooler fan (not shown), and then returns in the form of liquid fluorocarbon 4 to the evaporator 3 via the liquid return pipe 7. The fluorocarbon boils and condenses repeatedly as described above, such that the thyristors 1 are cooled efficiently.

FIG. 2 shows the principle of the conventional boiling type cooling device disclosed in the above mentioned journal (Mitsubishi Denki Giho vol. 148, No. 2). The heat generating element 1 such as thyristors is immersed in the pool of cooling medium, such as fluorocarbon R113 (trifluorotrichloroethane $C_2Cl_3F_3$) contained in the evaporator 3. When the fluorocarbon boils or evaporates, the pressure within the evaporator 3 increases. Thus, the vapor generated within the evaporator 3 proceeds into the condenser 5 to be condenser therein. The latent heat of evaporation absorbed by the vapor within the evaporator 3 and carried by it through the vapor pipe 6 is discharged in the condenser 5 by the condensing vapor. The condensed cooling medium 4 returns to the evaporator 3 via the liquid return pipe 7. Thus, continuous heat transport by means of evaporation and condensing is established, and the thyristor elements 1 are cooled continuously.

FIG. 3a and 3b show another conventional boiling type cooler device disclosed, for example, pressed Japanese patent publication No. 59-41307. Semiconducts 1 are in into contact with the evaporator 3, and the heat generated in the semiconducts 1 is transmitted to the liquid cooling medium 4 via the cooling fins 3a disposed within the evaporator 3. The vapor 4a generated in the evaporator 3 is guided via the vapor pipe 6 to the condenser 5 having radiation pipes 5a provided with radiation fins 5b. The condensed liquid cooling medium 4 returns to the evaporator 3 via the liquid return pipe 7.

FIG. 4 shows a deaeration device for the cooling medium (e.g., fluorocarbon 113) of a conventional boiling type cooling device. Coupled to a deaeration bath 8 containing cooling medium 4 are a plurality of pipes 11, 13, and 16, having valves 12, 14, and 17, respectively a sealed container 15 accomodating a heat-generating electrical device such as thyristor elements is coupled to the outer end of the pipe 16. Further a branch pipe 18 having a valve 19 is coupled to the cooling medium sealing pipe 16. The bath 8 is provided with an agitator 9 comprising a motor 9a, a shaft 9b, and agitation wings or spoons 9c. Further, the bath 8 is surrounded by a cooling shell (cooling box) 10.

The deaeration is effected as follows. First, keeping valves 12 and 17 in the closed state, valve 14 is opened to exhaust the interior of the bath 8 by means of an exhaust pump (not shown) coupled to pipe 13. Next, valve 14 is closed and valve 12 is opened to introduce liquid fluorocarbon 4 into the bath 8 via the pipe 11. After the bath 8 is filled to a predetermined level with the liquid fluorocarbon 4, valve 12 is closed again. Then, the liquid fluorocarbon 4 is cooled by the cooling shell 10 and is agitated by the agitator 9. Thereafter, valve 14 is opened to remove the non-condensing gas such as air from the liquid fluorocarbon 4. When the deaeration is over, valve 14 is closed.

Next, valve 19 is opened to exhaust the interior of the electrical device container 15 via the branch pipe 18. Thereafter, valve 19 is closed and valve 17 opened such that the liquid fluorocarbon 4 is introduced into the electrical device container 15.

The above conventional boiling type cooling devices all utilize fluorocarbons as the cooling medium for boiling and condensing heat transfer. However, recent research has shown that the fluorocarbons discharged into the atmosphere reach the stratosphere and destruct the ozonosphere. Thus, there is an urgent need for a substitute for fluorocarbons. Water has good cooling characteristics when boiled and is an obvious candidate for a substitute. However, the operating temperature of chopper devices, etc., (typical electrical devices mounted on railroad vehicles) usually ranges from $-20°$ C. to 80° C. Thus, water may freeze and cause failure in the cooling device if it is used as the cooling medium.

It is conceivable to add an antifreeze such as ethylene glycol to water. This, however, still leaves the following problems unsolved. Water boils and evaporates more easily than the glycol. Thus, the concentration of water decreases in the evaporator, while that in the condenser increases. As a result, the cooling efficiency is progressively reduced. In addition, the dilute condenser water may freeze in the condenser 5 or in the liquid return pipe 7 to cause a failure thereof at a low ambient temperature.

SUMMARY OF THE INVENTION

It is therefore a primary object of this invention to provide a boiling type cooler device which utilizes a harmless water-based cooling medium but which is not subject to failure even in a low temperature range. In particular, this invention aims at providing such a boiling type cooling device which is light-weight and small-sized.

When an antifreeze such as ethylene glycol is added to water, deaeration of the cooling medium effected by means of the device of FIG. 4 brings about a variation in the content thereof, since the medium contains two dissimilar components (i.e., water and antifreeze) having different boiling points. Thus, a further object of this invention is to provide a deaeration device which is capable of efficient deaeration of a multi-component medium having a predetermined content.

The first-mentioned object of this invention is accomplished in accordance with the first aspect of this invention by a boiling type cooling device comprising: an evaporator containing a cooling medium comprising water and an antifreeze liquid for lowering the freezing temperature of the cooling medium, the evaporator being in thermal contact with a body to be cooled, such that, due to heat transmitted from the cooled body, the cooling medium boils to generate vapor thereof; a condenser for condensing the vapor of the cooling medium generated in the evaporator; a vapor pipe connecting and communicating the evaporator to the condenser for transferring to the condenser, the vapor of the cooling medium generated in the evaporator; and a liquid return pipe connecting and communicating a lowest portion of the condenser to a portion of the evaporator, for transferring the cooling medium condensed in the condenser to the evaporator, the lowest portion of the condenser being at a level not lower than a level of the upper surface of the cooling medium in the evaporator, wherein a bottom surface of the condenser is tilted downward toward the lowest portion thereof. Preferably, the liquid return pipe is connected at a bottom end thereof to the bottom of the evaporator and opens upward at a central portion of the bottom of the evaporator. It is further preferred that the cooling medium comprise an aqueous solution of ethylene glycol.

According to a second aspect of this invention, the same object is accomplished by a boiling cooling device which comprises a fluid driving means disposed in the liquid return pipe for driving the condensed cooling medium within the liquid return pipe in a direction away from the condenser toward the evaporator. Preferably, the cooling device further comprises a separate conduit pipe connecting and communicating a bottom portion of the condenser to the evaporator such that when said fluid driving means drives the cooling medium, the cooling medium in the evaporator is transferred back to the condenser via the separate conduit pipe.

Further, according to a third aspect of the invention, the same object is accomplished by a cooling device in which the outer surface of the liquid return pipe is covered with a heat insulating material. Preferably, the top and the outer surfaces of said evaporator are also covered with a heat insulating material. Further it is preferred that the vapor pipe and the liquid return pipe be straight and tiled downward toward the evaporator.

According to a fourth aspect of this invention, the same object is accomplished by a boiling type cooling device in which the vapor pipe and the liquid return pipe both have such a curvature and attitude that the sign of $\Delta h/\Delta l$ remains unchanged over the whole length thereof, where $\Delta h$ is a vertical distance and $\Delta l$ is a horizontal distance of a point of the vapor pipe and the liquid return pipe from the evaporator to the condenser. It is preferred that the inner surfaces of the vapor pipe and liquid return pipe be covered with a water repellent material.

According to a fifth aspect, the same object is accomplished by a boiling type cooling device comprising an elastic member disposed within the liquid return pipe and extending therethrough to leave a space in the liquid return pipe for the cooling medium to flow therethrough, the elastic member having a sufficient elasticity at a freezing temperature of the cooling medium to effectively absorb expansion of volume of the freezing cooling medium within the liquid return pipe.

The second-mentioned object of this invention is accomplished by a deaeration device for a cooling medium including a plurality of liquid components, comprising at least one deaeration bath for deaerating said liquid components separately from each other and a mixing bath for mixing therein the liquid components deaerated in the bath. Preferably, the cooling medium comprises water and ethylene glycol, the deaeration device comprising two deaeration baths for separately deaerating water and ethylene glycol, respectively.

BRIEF DESCRIPTION OF THE DRAWINGS

The novel features which are believed to be characteristic of this invention are set forth with particularity in the appended claims. This invention itself, however, both as to is structure and method of operation, together with further objects and advantages thereof, may best be understood from the detailed description of the preferred embodiments, considered in connection with the accompanying drawings, in which:

FIGS. 3a and 3a show another conventional boiling type cooler device, wherein FIG. 3a is a vertical sectional view and FIG. 3b a horizontal section along line B—B in FIG. 3a;

FIGS. 17a and 17b are views similar to FIGS. 3a and 3b, respectively, showing an embodiment according to the fifth aspect of this invention, wherein FIG. 17a shows a section along line XVIIA—XVIIA of FIG. 18, and FIG. 17b shows a section along line B—B of FIG. 17a;

In the drawings, like reference numerals represent like or corresponding parts.

DETAILED DESCRIPTION OF THE PREFERRED EMBODIMENTS

Figure 5:
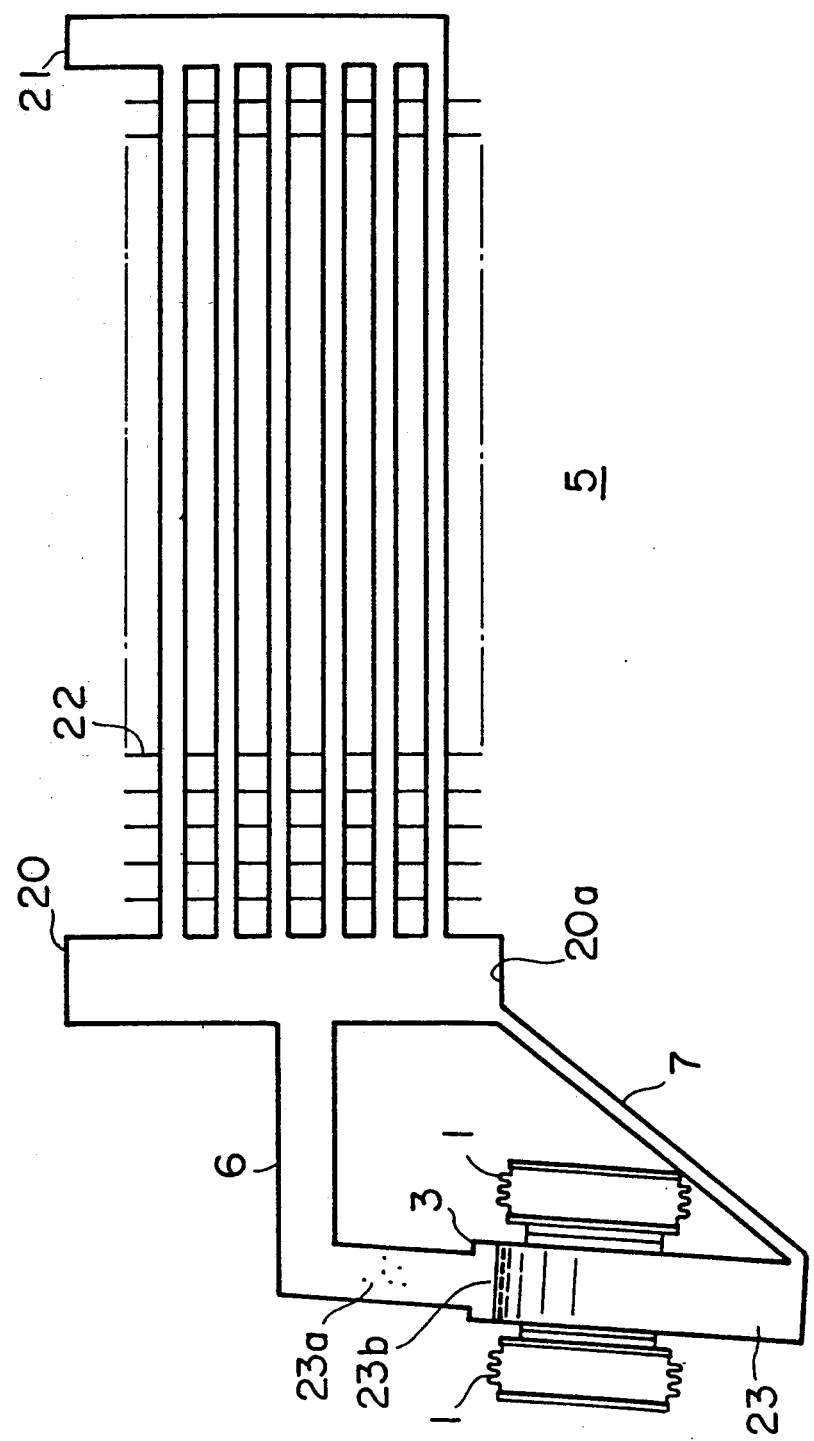
FIG. 5 is a schematic vertical sectional view of a boiling type cooling device according to a first aspect of this invention.

FIG. 5 shows a boiling cooling device of the separate cooling fin type for cooling a thyristor device according to the first aspect of this invention. In FIG. 5, an evaporator 3 is coupled to a condenser 5 via a vapor pipe 6 and a liquid return pipe 7. The boiling type cooling device comprises a plurality of evaporators 3 which are provided separately for respective units of thyristor elements 1, and thus the co-called separate fin type structure is adopted. The condenser 5 comprises a pair of headers 20 and 21 and a plurality of finned condensing tubes 22 extending in parallel and communicating between the two headers 20 and 21. The cooling medium 23 comprises an aqueous solution of ethylene glycol, i.e., a mixture of water and ethylene glycol utilized as an antifreeze.

The positional relationship between the evaporators 3 and the condenser 5 is determined in such a manner that the level of the lowest portion of the condenser 20, i.e., the bottom 20a of the header 20 in the case of this embodiment, is higher than, or at least equal to, the level 23b of the cooling medium 23 contained in the evaporator 3. Further, the top end of the liquid return pipe 7 is coupled to the bottom of the header 20. The bottom end of the liquid return pipe 7 is coupled to the bottom or the neighborhood of the bottom of the evaporator 3. Further, the finned tubes 24a are tilted downward toward the header 20 above the top end of the liquid return pipe 7.

The methods of cooling operation of the device of FIG. 5 are fundamentally similar to those of conventional cooling devices. Thus, the heat generated in the thyristor elements 1 due to the power loss therein is transmitted via the walls of the evaporator 3 to the cooling medium 23 in the evaporator 3. The medium 23 thus boils. The vapor 23a resulting from the boiling medium 23 in the evaporator 3 travels into the header 20 of the condenser 5 via the vapor pipe 6. The vapor 23a is cooled and condensed while transported through the condensing pipes 22 and the header 21. The condensed medium 23 returns to the evaporator 3 via the bottom portion of the header 20 and the liquid return pipe 7.

Next, the boiling or ebullition cooling characteristics and the freezing temperature characteristics of the aqueous solution of ethylene glycol, which is utilized as the cooling medium 23 in the above embodiment, will be described in detail.

Figure 6:
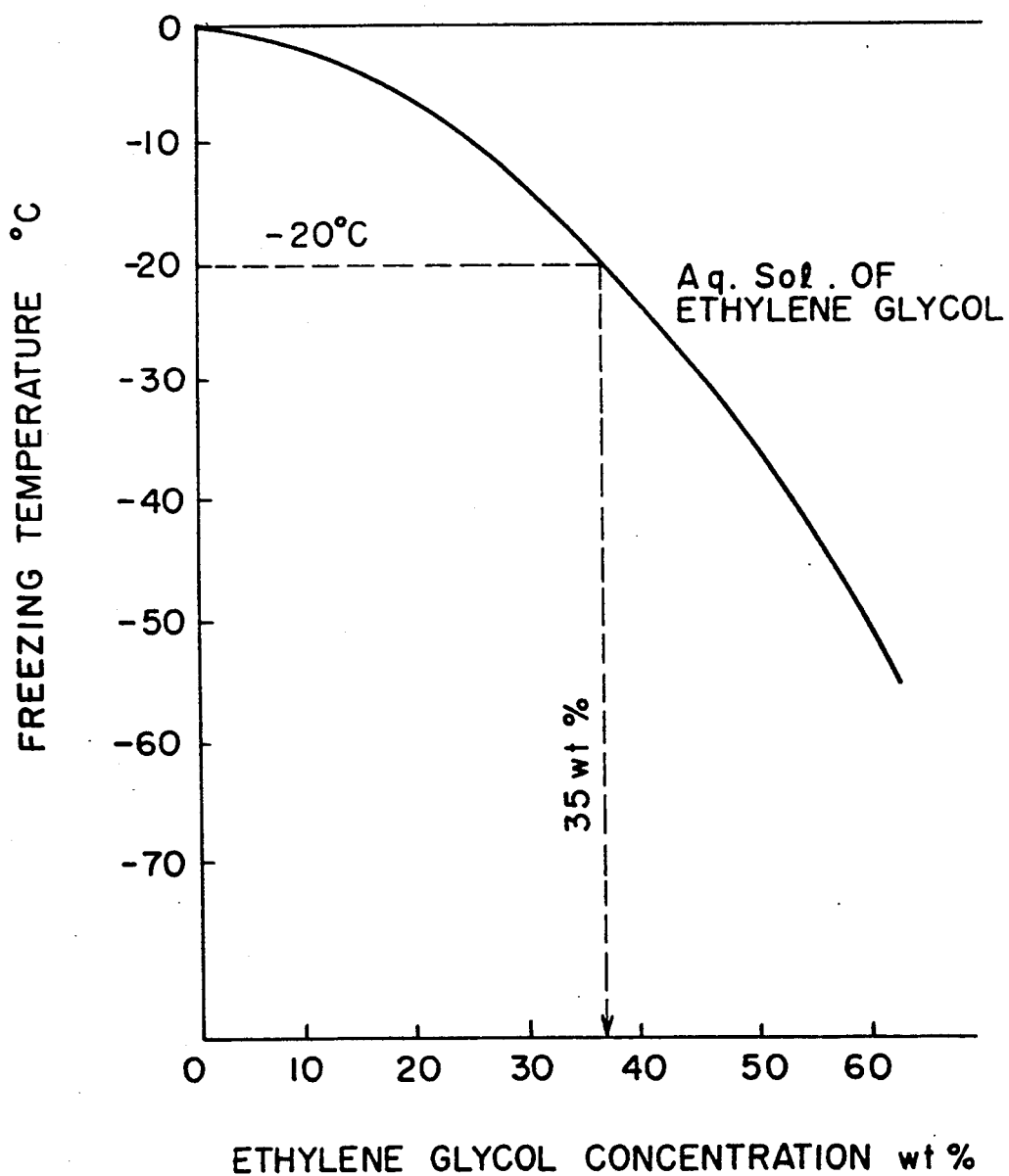
FIG. 6 shows the freezing temperature of an aqueous solution of ethylene glycol with varying concentration of ethylene glycol.

First, FIG. 6 shows the freezing temperature of an aqueous solution of ethylene glycol with respect to the concentration of ethylene glycol (plotted in wt. % along the abscissa). The lower operational temperature limit of electrical devices mounted on railroad vehicles is usually −20° C. Thus, it can be seen from FIG. 6 that the concentration of ethylene glycol is preferably selected at about 35 wt. %.

Figure 7:
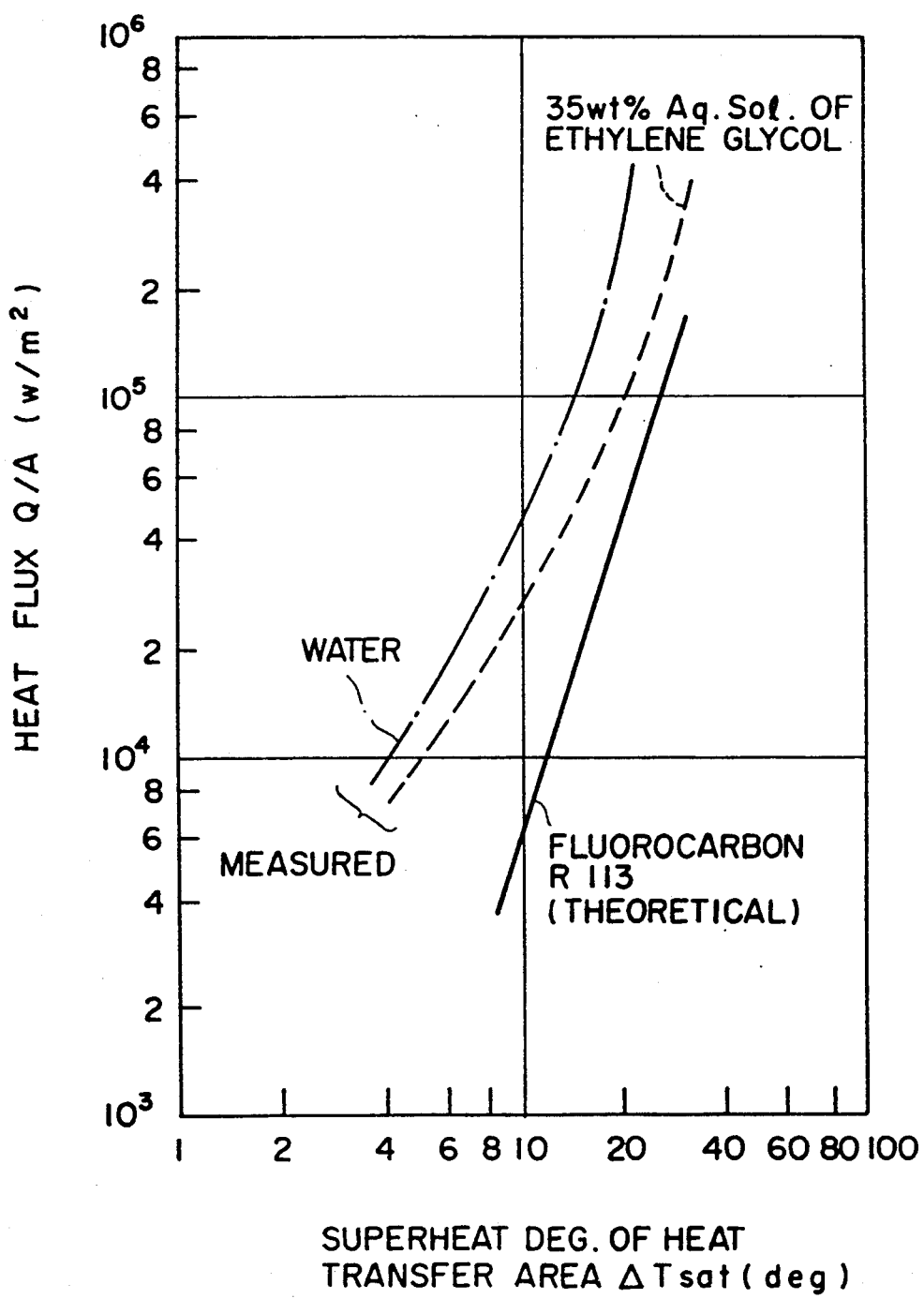
FIG. 7 shows boiling curves of several cooling media.

FIG. 7 shows the boiling curves (heat flux versus superheating degree of the heat transfer surfaces) of three cooling media; water (the dot and dash curve), a 35 wt. % aqueous solution of ethylene glycol (the dotted curve), and fluorocarbon R113 (the solid curve). As can be seen from FIG. 7, the ebullition cooling characteristics of an aqueous solution of ethylene glycol are superior to those of fluorocarbon R113, although inferior to those of water. Namely, the cooling performance of a 35 wt. % aqueous solution of ethylene glycol is superior to that of a conventional medium.

The above characteristics are obtained by assuming that the content of the cooling medium 23, i.e., the ratio of ethylene glycol to water, is keep constant throughout the system. However, the ratio varies as the cycles of boiling and condensing are repeated. As a result, the freezing temperature and the boiling characteristics are changed. Next, the means employed in this embodiment for suppressing the variation of the content of the aqueous solution of ethylene glycol will be described.

Water boils more actively in the evaporator 3 than the ethylene glycol, thereby reducing the ratio of water in the cooling medium in the evaporator 3. Thus, the ethylene glycol is concentrated in the evaporator 3. As a result, the ebullition cooling characteristics deteriorate and the specific gravity of the cooling medium 23 tends to increase. On the other hand, the vapor 3a entering the condenser 5 has a high water content and a low content ethylene glycol. Thus, the specific gravity thereof decreases while the freezing point thereof rises.

In embodiment of FIG. 5, for the purpose of decreasing the above tendency, the following measures are taken. The level of the lowest portion of the condenser 5 is made higher than the liquid surface level within the evaporator 3, such that the condensed liquid may quickly be returned to the evaporator 3. In addition, the liquid return pipe 7 opens into the evaporator 3 at the bottom portion thereof, so the cooling medium is agitated due to the difference in the specific gravity of the concentrated and dilute solutions. Thus, supply of water-rich liquid into the evaporator 3 and agitation thereof with the glycol-rich medium in the evaporator 3 is promoted, and the deterioration of the ebullition cooling characteristics is suppressed.

Further, the condensed water generated within the condenser 5 is diluted and hence has a relatively high freezing temperature. However, since the bottom surfaces of the condenser 5 are tilted toward the end of the liquid return pipe 7, the condensed liquid flows continuously without stop, and the freezing thereof is thus prevented.

By adopting a double-wall (i.e., two-wall) structure for the liquid return pipe 7 and inserting a heat insulating material such as air between the two walls, the prevention of freezing can further be ensured.

In the preceding description, the material of the evaporator 3, etc. has not been specified. However, when an aqueous solution of ethylene glycol is utilized as the cooling medium 23, copper is preferred as a material for the evaporator 5 and other parts thereof. The corrosive speed of a 38 percent by weight aqueous solution of ethylene glycol, for example, is 0.041 mm per year in the case of soft steel, 0.059 mm per year in the case of zinc, but only 0.0017 mm per year in the case of copper.

Although the above embodiment is used for cooling thyristor elements, this invention is applicable with the same meritorious effects as described above to any boiling cooler devices for cooling various kinds of bodies.

Figure 8:
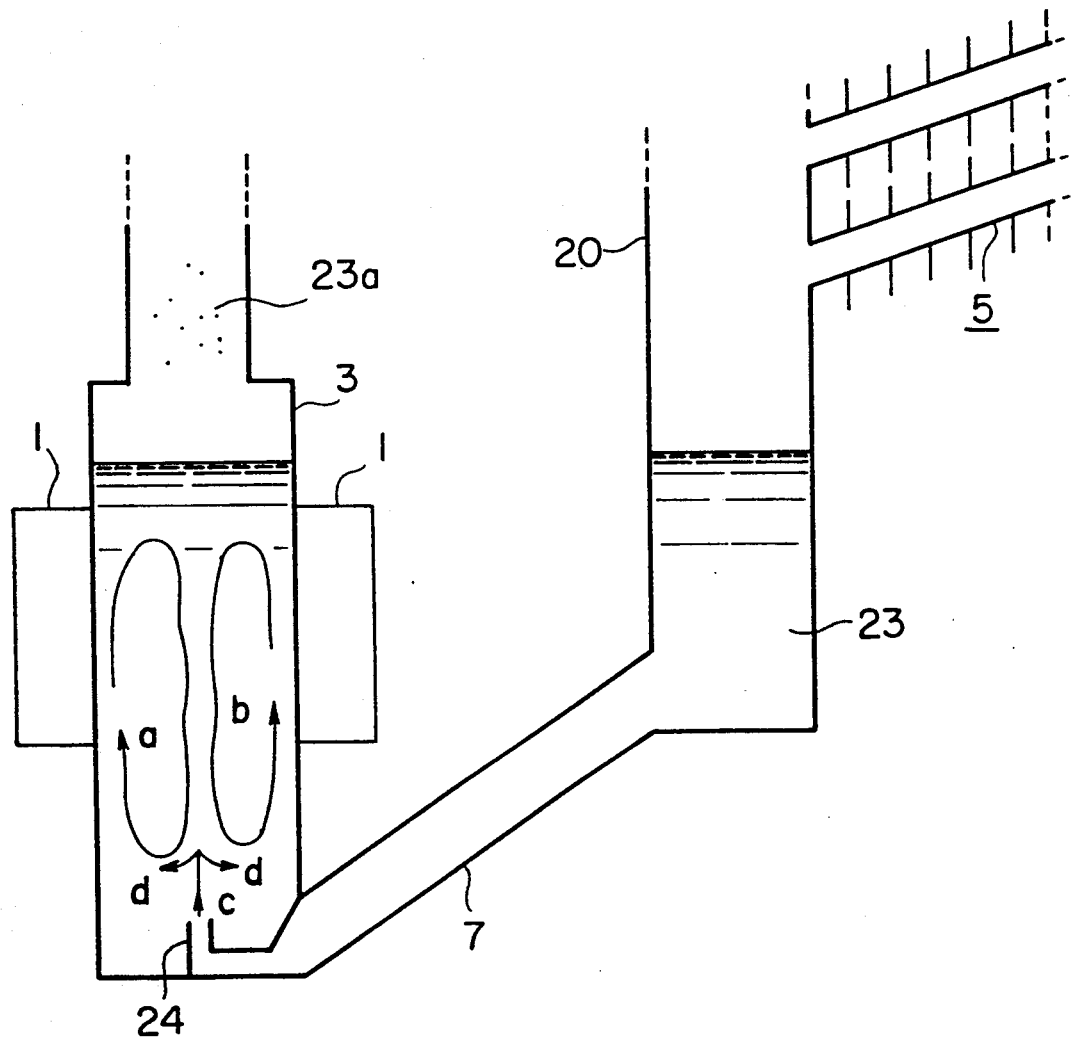
FIG. 8 is a partial sectional view of another boiling type cooling device according to the first aspect.

FIG. 8 shows a second embodiment according to a first aspect of this invention. The cooling medium 23 is an aqueous solution of ethylene glycol, and an outlet port 24 of the condensed medium to the evaporator 3, i.e., the opening at the bottom end of the liquid return pipe 7, is directed upward at the center of the bottom of evaporator 3. The cooling medium flowing into the evaporator 3 is thus directed upward as shown by arrow c. Within the evaporator 3, however, convection occurs, due to the heat from the thyristor elements 1, as shown by arrows a and b, and the flow due to convection is directed downward at the center of evaporator 3. Thus, the upward flow of the dilute condensed liquid from the port 24 as indicated by arrow c collides with the downward convection of medium at the center of evaporator 3 as indicated by arrows a and b, and thus is dragged by the flows of convection and is deflected sideways as indicated by arrows d. Thus, the dilute condensed medium returned promptly from the condenser 5 to the evaporator 3 is rapidly and effectively mixed and dispersed within the glycol-rich cooling medium 24 within the evaporator 3. This accomplishes the uniformization of the cooling medium 23.

Figure 9:
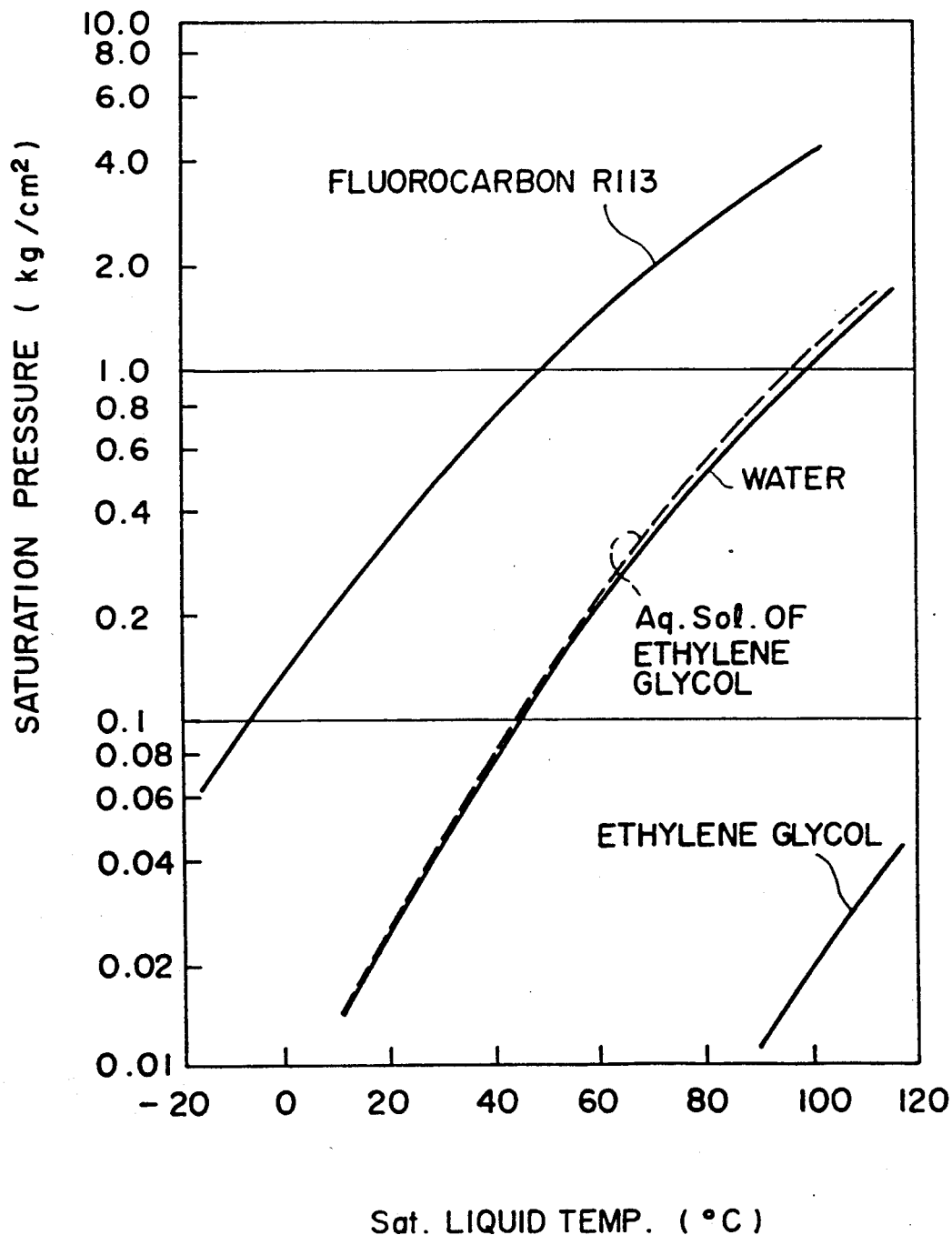
FIG. 9 shows saturation pressure of several cooling media with respect to the saturated liquid temperature.

As shown in FIG. 9, the saturation pressure versus saturated liquid temperature characteristics of a 35 wt. % aqueous solution of ethylene glycol (represented by a dotted curve) are substantially the same as those of water (shown by a solid curve near the dotted curve). Thus, the saturated pressure of a 35 wt. % aqueous solution of ethylene glycol is lower than atmospheric pressure within the ebullition cooling operational temperature range of the thyristor elements 1 (usually from about $-20°$ C. to $90°$ C.). It is therefore necessary, in contrast to the case of fluorocarbon R113, to make the device air-tight such that atmospheric air, etc., may not leak into the condenser 5, evaporator 3, vapor pipe 6, or liquid return pipe 7. It is known that the intrusion into the condenser 6 of non-condensing gases such as air usually deteriorates the cooling performance.

Figure 10:
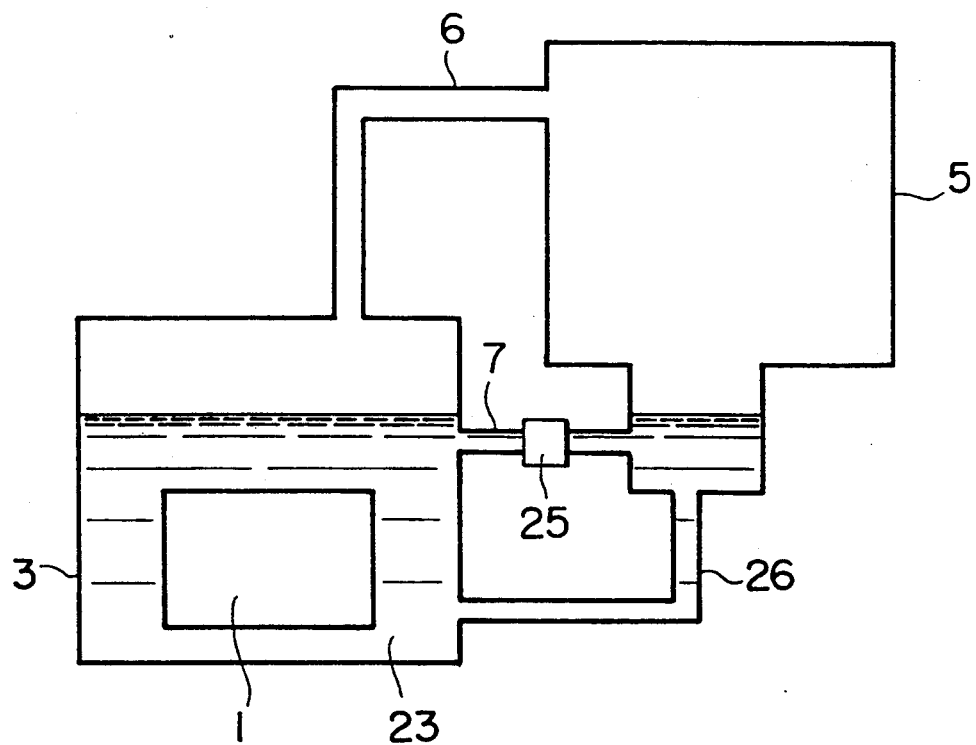
FIG. 10 is a view similar to FIG. 2 showing an embodiment according a second aspect of this invention.
Figure 11:
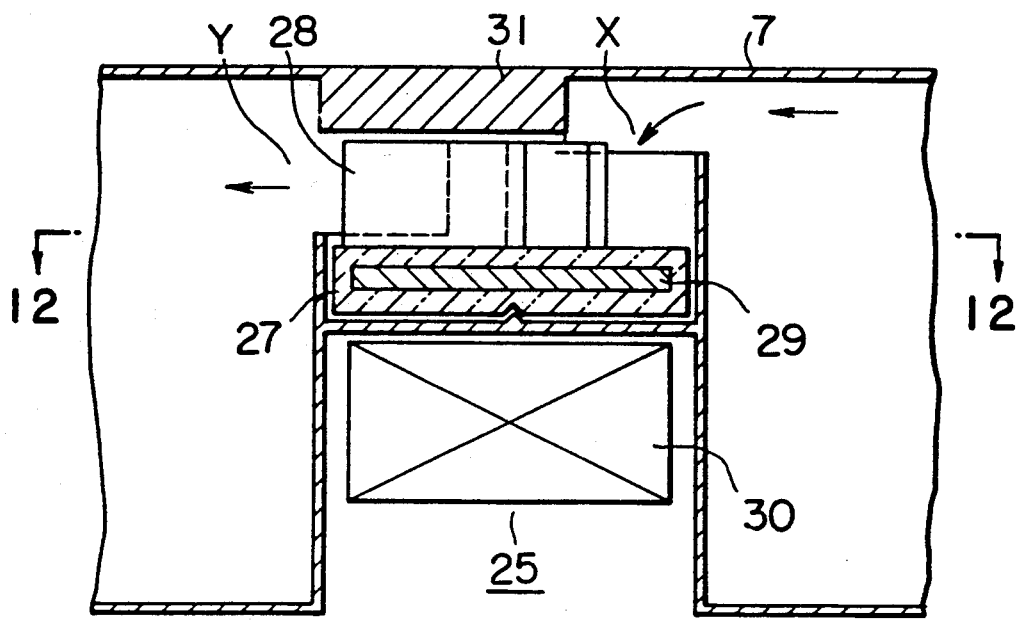
FIG. 11 shows a vertial sectional view of the liquid pump of FIG. 10.
Figure 12:
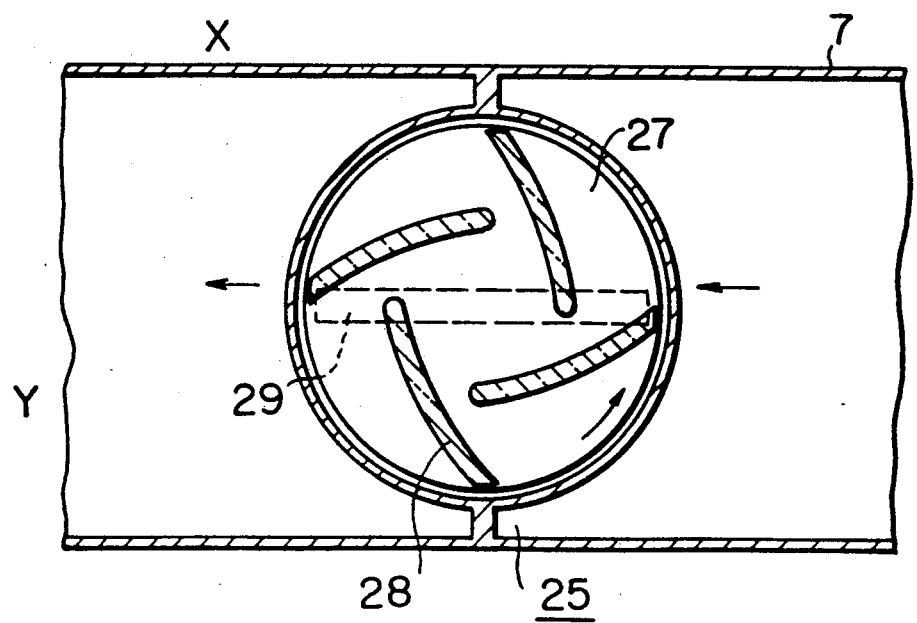
FIG. 12 shows a section along line XII—XII of FIG. 11.

FIGS. 10 through 12 show an embodiment according to the second aspect of this invention. As shown in FIG. 10, an electrical element 1, such as a power thyristor for railroad vehicles, is immersed in a cooling medium 23 consisting of a 35 wt. % aqueous solution of ethylene glycol contained in an evaporator 3. The evaporator 3 communicates with the condenser 5 via a vapor pipe 6 and a liquid return pipe 7. A fluid driving device 25, such as a diaphragm pump, is disposed at the middle of the liquid return pipe 7. Further, a separate conduit for condensed medium 26 connects the bottom of the condenser to the evaporator 3.

The method of operation of the fluid driving device or pump 24 is as follows. After ebullition cooling is stopped, the pump 25 is started so as to force the condensed medium remaining within the condenser 5 into the evaporator 3. Thus, the cooling medium circulates repeatedly along the following cyclic path: from condenser 5, through the liquid return pipe 7, through the evaporator 3, through the condensed liquid conduit 26, and back to the condenser 5. Thus, the cooling medium 23 is quickly mixed and resumes the original uniform composition. The operation of the pump 25 is stopped by means of a sequential relay, etc., after an appropriate time. Although it is possible to reverse the direction of the cyclic transport of the cooling medium 23, the above described direction (i.e., from the evaporator 3 to the condenser 5 by the pump 25) is preferred, since the complete immersion of the electric element 1 in the cooling medium within the evaporator 3 ensures enhanced safety upon restarting cooling operation of the boiling type cooler device.

The pump 25 may comprise a commercially available fluid pump such as a diaphragm pump. The pump 25 preferably has a structure whereby the drive portion thereof does not come into contact with the fluid. FIGS. 11 and 12 show a magnetic pump 25 as an example of such a pump. The pump 25 has an impeller in the form of a rotatable disk 27 having four blades 28 formed on the upper surface thereof projecting into the conduit 7 and a permanent bar magnet 29 embedded therein. A driving body 30 for rotating the impeller is disposed outside of the conduit 7. A portion of the bottom wall of the conduit 7 is retracted inward to form a neck portion of reduced cross-sectional area where the base disk 27 and the blades 28 of the pump are disposed. The base disk 27 is rotatably fitted within a cylindrical casing of corresponding height formed on the bottom of the neck portion of the liquid return pipe 7. The side wall of the casing extends upward at the inlet side X (see FIG. 11) to a height substantially equal to the top of the blades 28. Further, a partition block 31 projects inward into the conduit 7 from the upper portion of the neck portion to oppose the top ends of the blades 28 with a small clearance therebetween. Thus, the portions of the conduit 7 to the left and to the right of the pump 25 communicate with each other through the neck portion of the conduit 7 solely via the inlet portion X above the top of the blades 28, the spaces between the blades 28, and the outlet portion Y on the outlet side of the blades 28 (see FIG. 11). Thus, when the disk 27 rotates in the counterclockwise direction as viewed from the top as shown in FIG. 12, the cooling medium is taken in from the inlet portion X into the pump 25 and let out from the outlet portion Y, being driven by the rotating blades 28 projecting into the neck portion of the conduit 7. The outside driving body 30 for generating a magnetic flux is accomodated within a recess formed in the neck portion of the conduit 7. When the outside driving body 30 rotates, the bar magnet 29 embedded in the disk 27 is driven and tries to follow the rotation of the driving body 30, and the disk 27 is thus rotated.

The device according to the above described second aspect of the invention effectively mixes the water-rich condensed liquid and the glycol-rich medium in the evaporator. Thus, an undue rise of the congealing point (freezing point) of the cooling medium, and hence the freezing of the condensed liquid, can be prevented.

Figure 13:
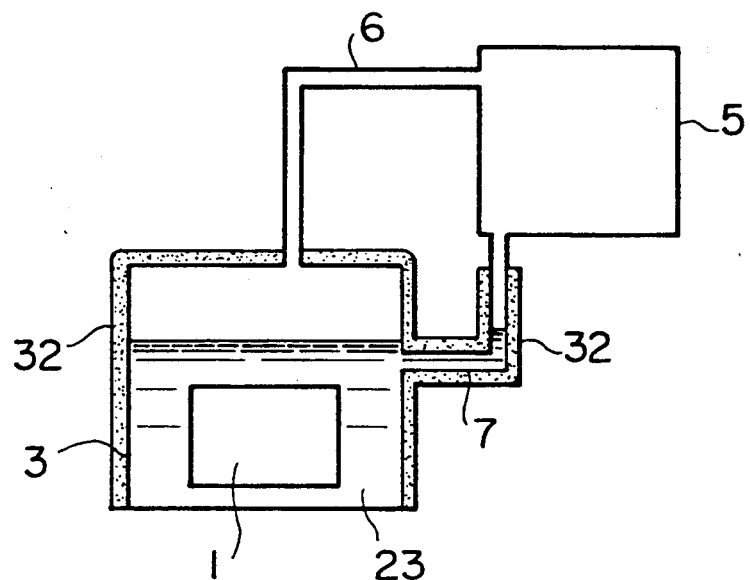
FIGS. 13 through 15 are views similar to FIG. 10, showing embodiments according to the third aspect.

FIG. 13 shows a first embodiment according to the third aspect of this invention. A liquid return pipe 7 and an evaporator 3 are covered with a heat insulating material 32. A vapor pipe 6 and the liquid return pipe 7 connect the evaporator 3 to a condenser 5. The same reference numerals as in FIG. 10 represent like or corresponding parts.

The method of operation of the cooling device of FIG. 13 is as follows. The cooling device is mounted on a railroad vehicle. When the electric element 1 generates heat during vehicle operation, a portion of the cooling medium 23, consisting a of 35 wt. % aqueous solution of ethylene glycol having a freezing point (congealing point) of $-20°$ C. and sealed in the evaporator 3 after deaeration, boils due to the heat transmitted thereto from the electric element 1. Since the vapor pressure of water is higher than that of the ethylene glycol, the medium 23 in the evaporator 3 is concentrated and becomes rich in glycol, while the condensed liquid in the condenser 5 becomes dilute. Although the dilute liquid in the condenser 5 communicates with the concentrated liquid in evaporator 3, they are not mixed together even after the operation of the electric element 1 is stopped. Thus, when the ambient temperature is low, the dilute liquid in the condenser 5, which contains more water than the original medium (containing 65 wt. % water), begins to freeze at a temperature higher than −20° C., as can be seen from FIG. 6.

In the case of the device of FIG. 13, however, the liquid return pipe 7 is covered with a heat insulating material 32. Thus, the freezing (congealing) of the dilute liquid having a high congealing or freezing temperature remains unfrozen to the last moment. On the other hand, since the bottom of the evaporator 3 is in contact with the ambient air, the freezing proceeds from this bottom portion of the evaporator 3, and the liquid 23 near the interface between the liquid and the gas phase freezes at the last moment.

Figure 14:
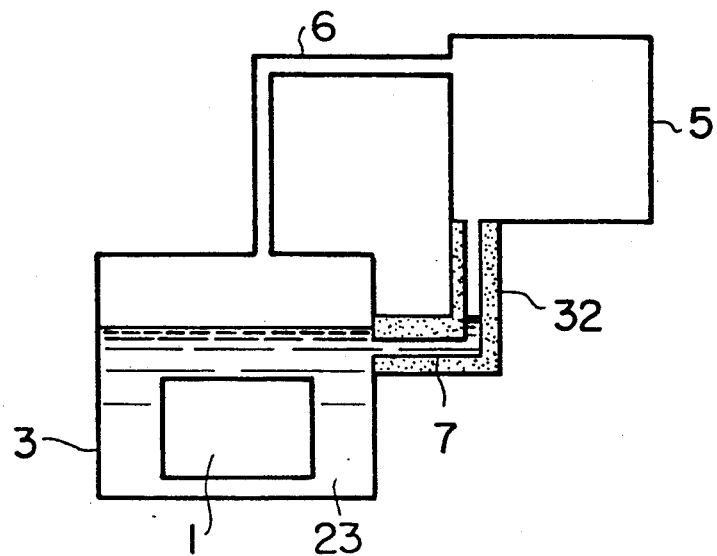

FIG. 14 show another embodiment according to a third aspect of this invention. Only the liquid return pipe 7 is covered with a heat insulating material 32. In this case, the inner diameter of the vapor pipe 6 may be reduced to a minimum which allows the passage of the vapor through the pipe even after water droplets are attached to the inner walls thereof, and the freezing of the liquid within the liquid return pipe 7 proceeds upward and ends at the side of the condenser 5.

Figure 15:
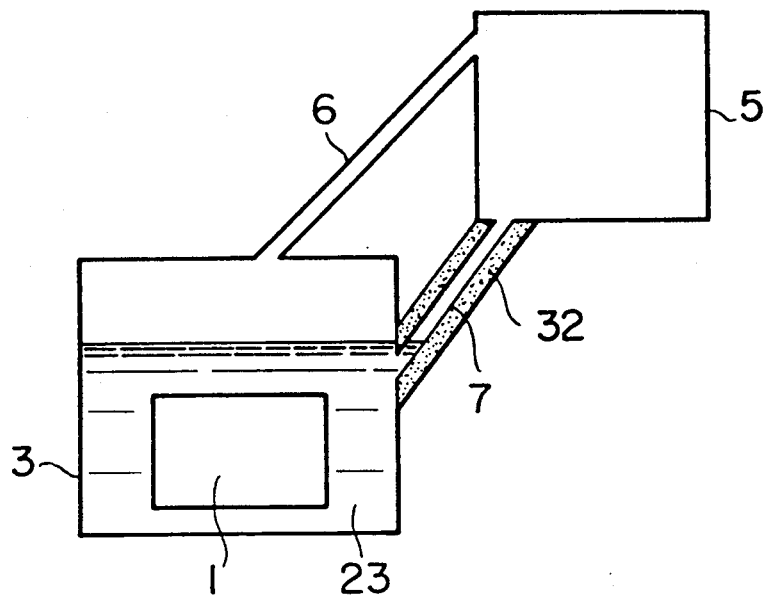

FIG. 15 shows a modification wherein the vapor pipe 6 and the liquid return pipe 7 are both straight and are tilted substantially downward toward the evaporator 3, while the liquid return pipe 7 is covered with a heat insulating material 32. As a result, it is difficult for the droplets to attach to the inner walls of the pipes 6 and 7 they disappear quickly. The inner diameter of the pipes may be reduced in this case.

Although the above embodiments of the third aspect of this invention relate to the case in which the electric element is immersed in the cooling medium, this aspect is also applicable to cooling devices of the separate fin type. Further, this aspect of the invention is applicable to the case where the cooling medium comprises water and alcohol. In such a case, the freezing point of the liquid in the evaporator becomes higher than that of the liquid in the condenser. However, the meritorious effect of the insulating material of this aspect can be obtained in such cases as well.

Figure 16:
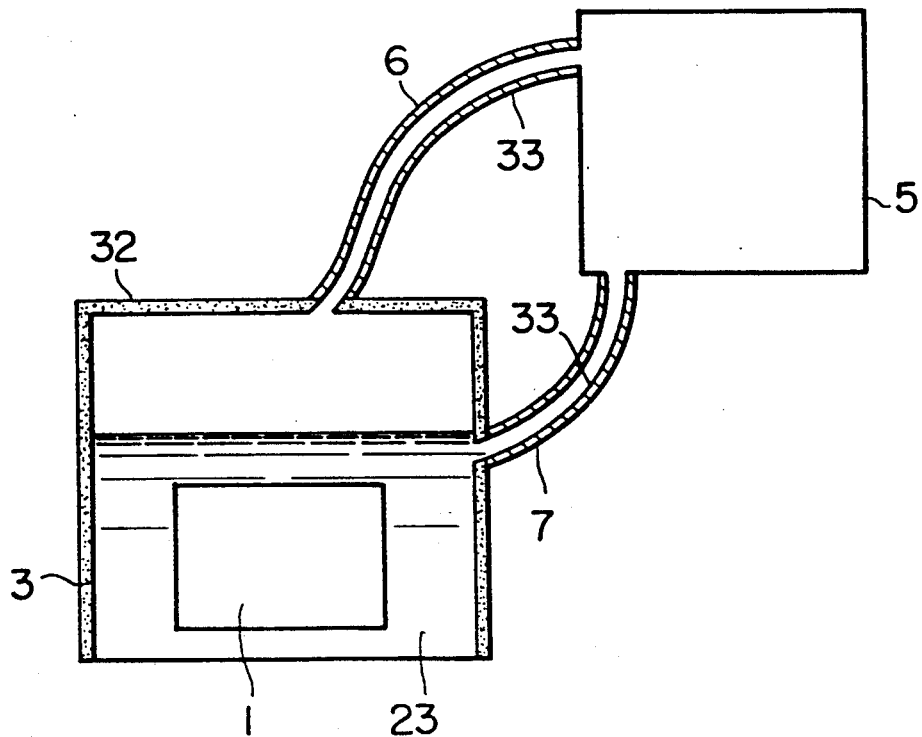
FIG. 16 is also a view similar to FIG. 10, showing an embodiment according to the fourth aspect of this invention.

FIG. 16 shows an embodiment according to the fourth aspect of this invention. The vapor pipe 6 and the liquid return pipe 7 both have such a form (curvature and attitude or relative position) that $\Delta h/\Delta l$ remains positive or negative (i.e., $>0$ or $<0$) over the whole length thereof, wherein $\Delta h$ is the increment of the vertical distance and $\Delta l$ is the increment of the horizontal distance from the side of the evaporator 3 to the condenser 5. The evaporator 3 is covered with a heat insulating material 32 except at the bottom. Further, the inner walls of the pipes 6 and 7 are coated with a water repellent material 33, such that the condensed liquid may quickly be removed therefrom. Thus, the condensed liquid can be effectively prevented from remaining within the pipes. In addition, the curved geometery of the pipes ensures increased ease of installation.

Figure 1:
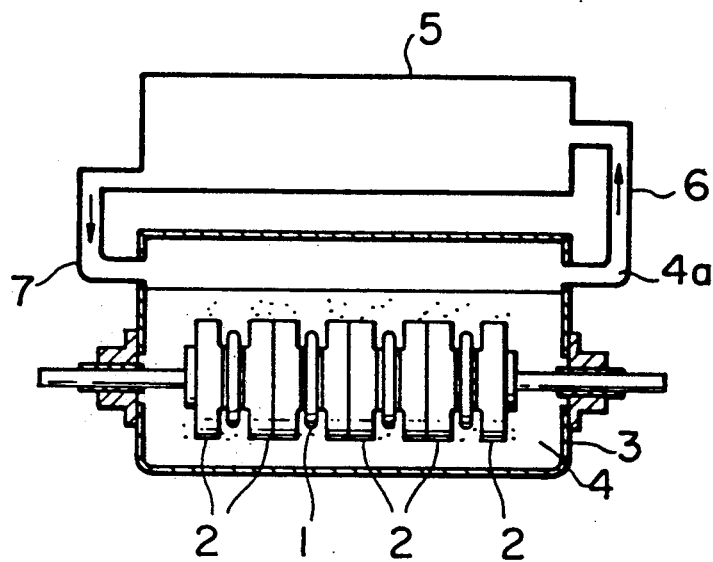
FIGS. 1 and 2 are vertical sectional views of conventional boiling type cooling devices.
Figure 2:
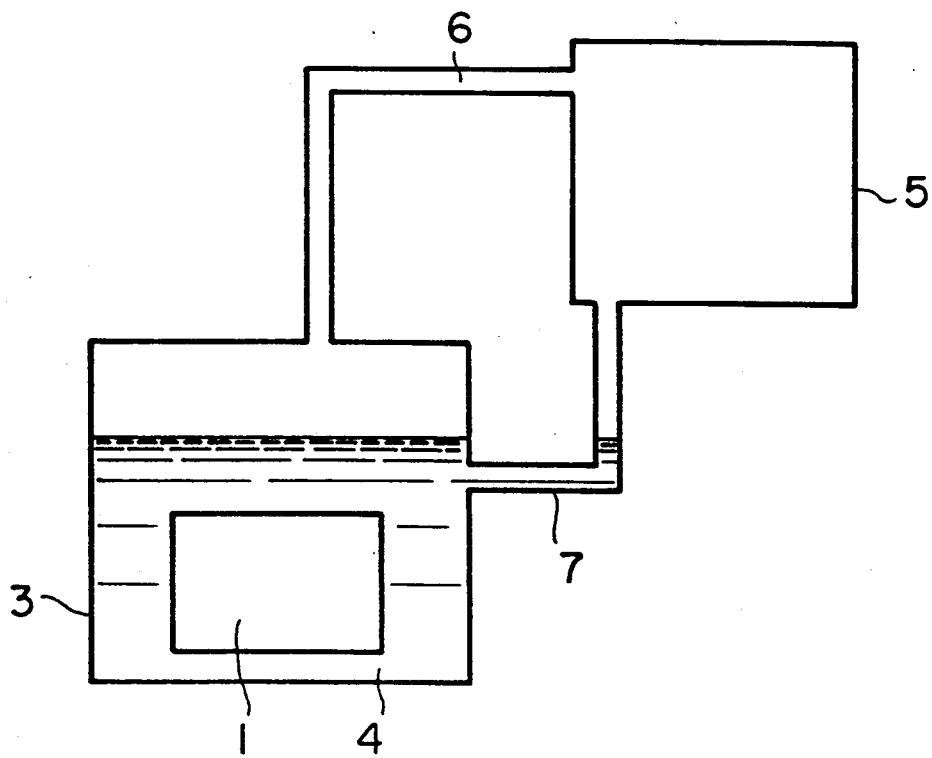
Figure 3A:
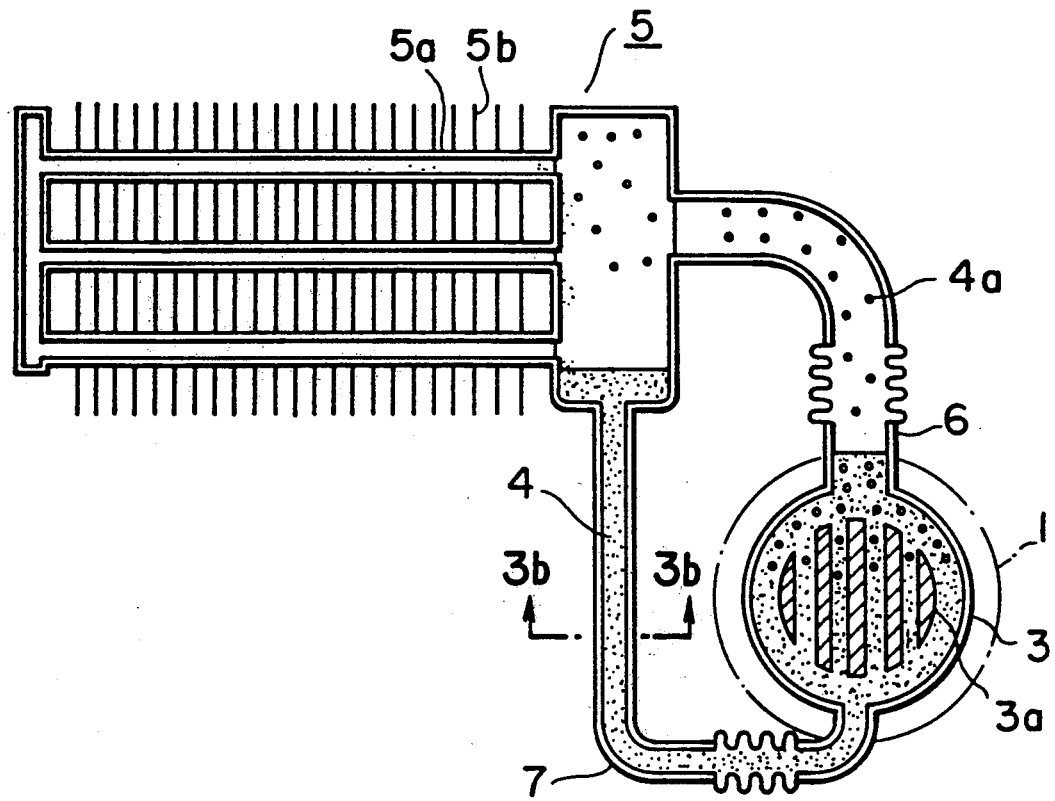
Figure 3B:
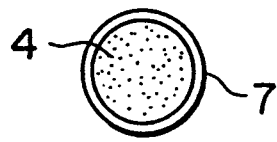
Figure 17A:
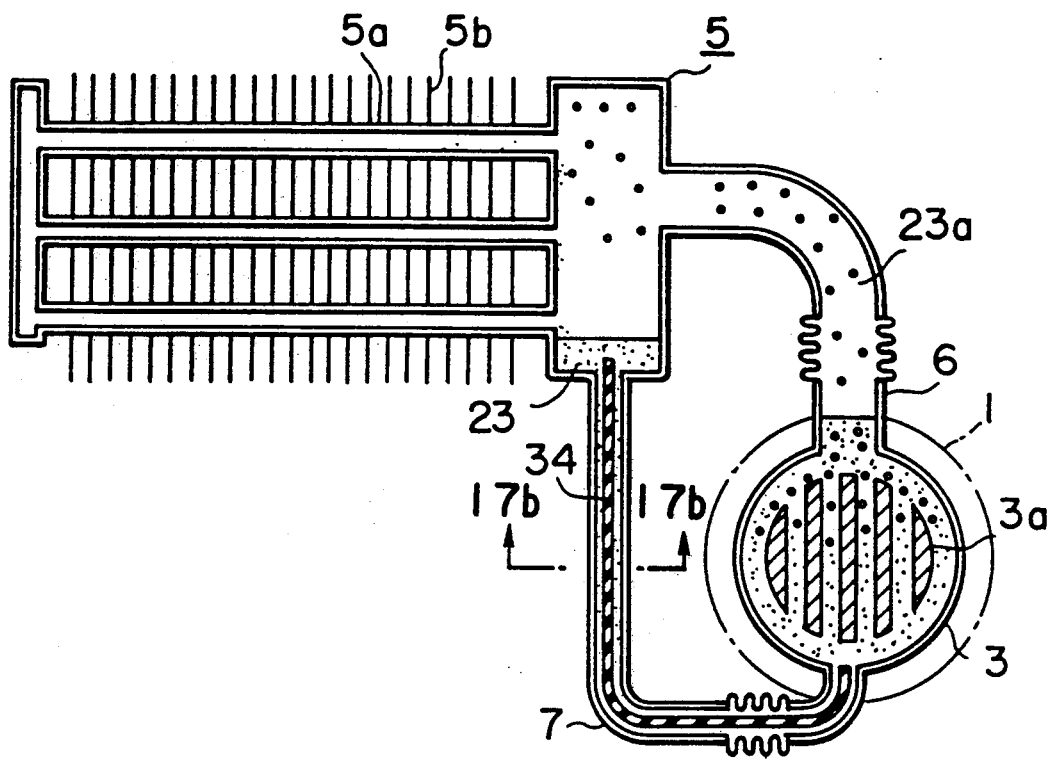
Figure 17B:
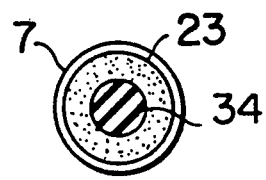
Figure 18:
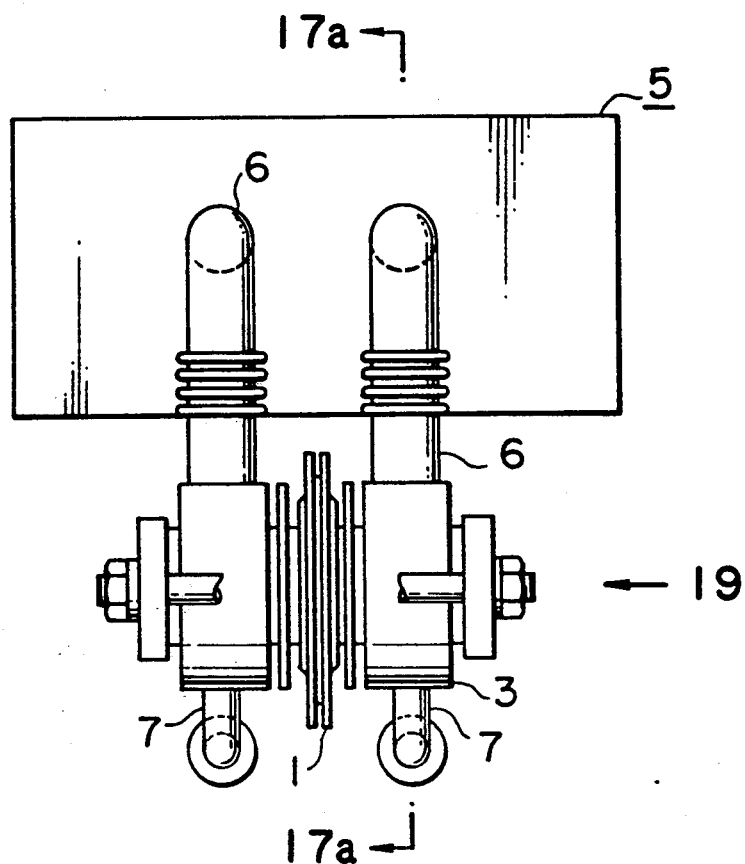
FIG. 18 is an end view of the boiling type cooling device of FIGS. 17a and 17b.
Figure 19:
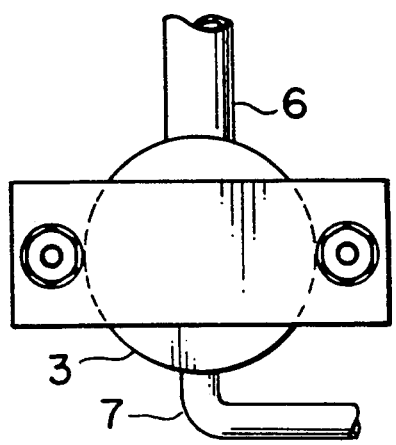
FIG. 19 show a partial side view as indicated by the arrow XIX in FIG. 18.

FIGS. 17 through 19 show an embodiment according to a fifth aspect of this invention. The cooling device is similar to that shown in FIG. 3, with like reference numerals representing like or corresponding parts. However, an elastic bar or string member 34 made of a soft silicone rubber extends centrally within the liquid return pipe 7 over the whole length thereof. Thus, the cooling medium 23 consisting of an aqueous solution of ethylene glycol flows through the pipe 7 between the outer side of the elastic member 34 and the inner wall of the liquid return pipe 7.

In the case where the cooling device is mounted on a railroad vehicle operating in a cold climate, the cooling medium 23 filling the liquid return pipe 7 may freeze. However, the elastic member 34 is effective in preventing the failure of the liquid return pipe. Namely, the expansion of volume of the freezing medium, which otherwise develops a stress in the wall of the liquid return pipe 7, is absorbed by the elastic member 34, and hence the stress developed in the wall of the liquid return pipe 7 is effectively reduced. On the other hand, since the space within the evaporator 3 opens upwards, the expansion of the freezing medium does not develop undue stresses in the walls of the evaporator 3.

The form of the elastic member 34 is not limited to that of a string or rod. It may take a helical or spiral form, or the form of a tube. Further, the elastic member 34 may be made of any material which retains its elasticity at the freezing temperature of the cooling medium. This aspect of this invention is applicable to cooling devices utilizing a medium which may freeze at a lower operating temperature.

Figure 4:
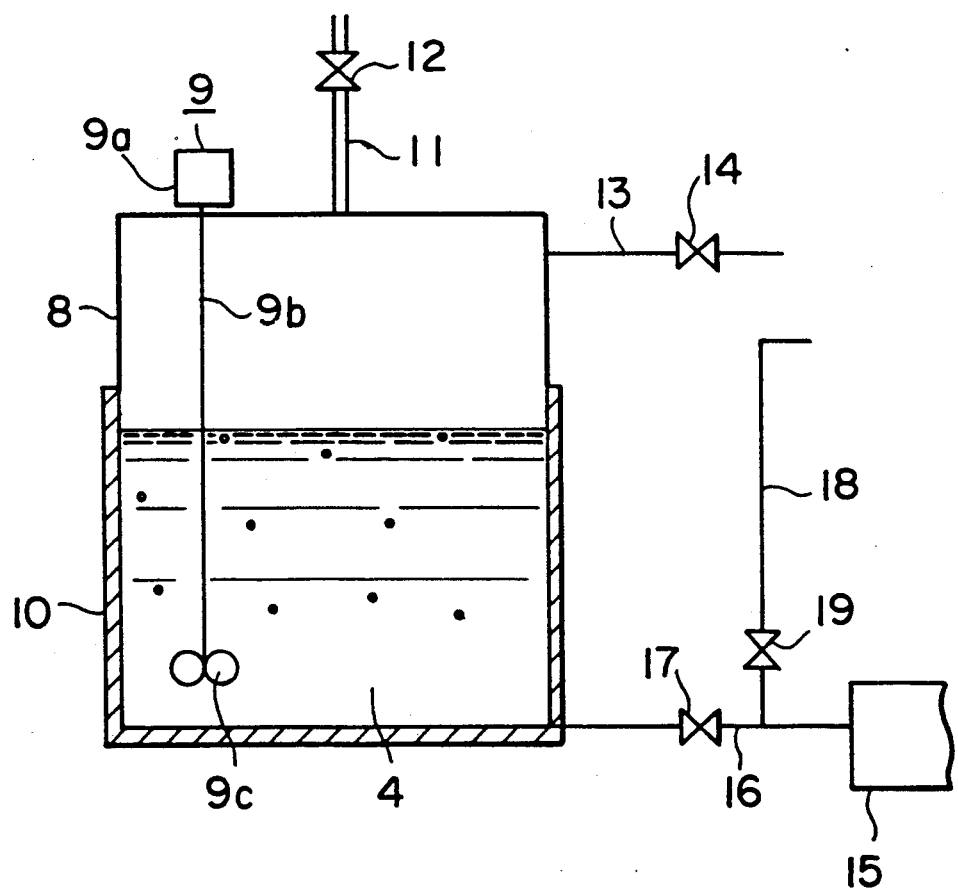
FIG. 4 is a vertical sectional view of a conventional deaeration device.
Figure 20:
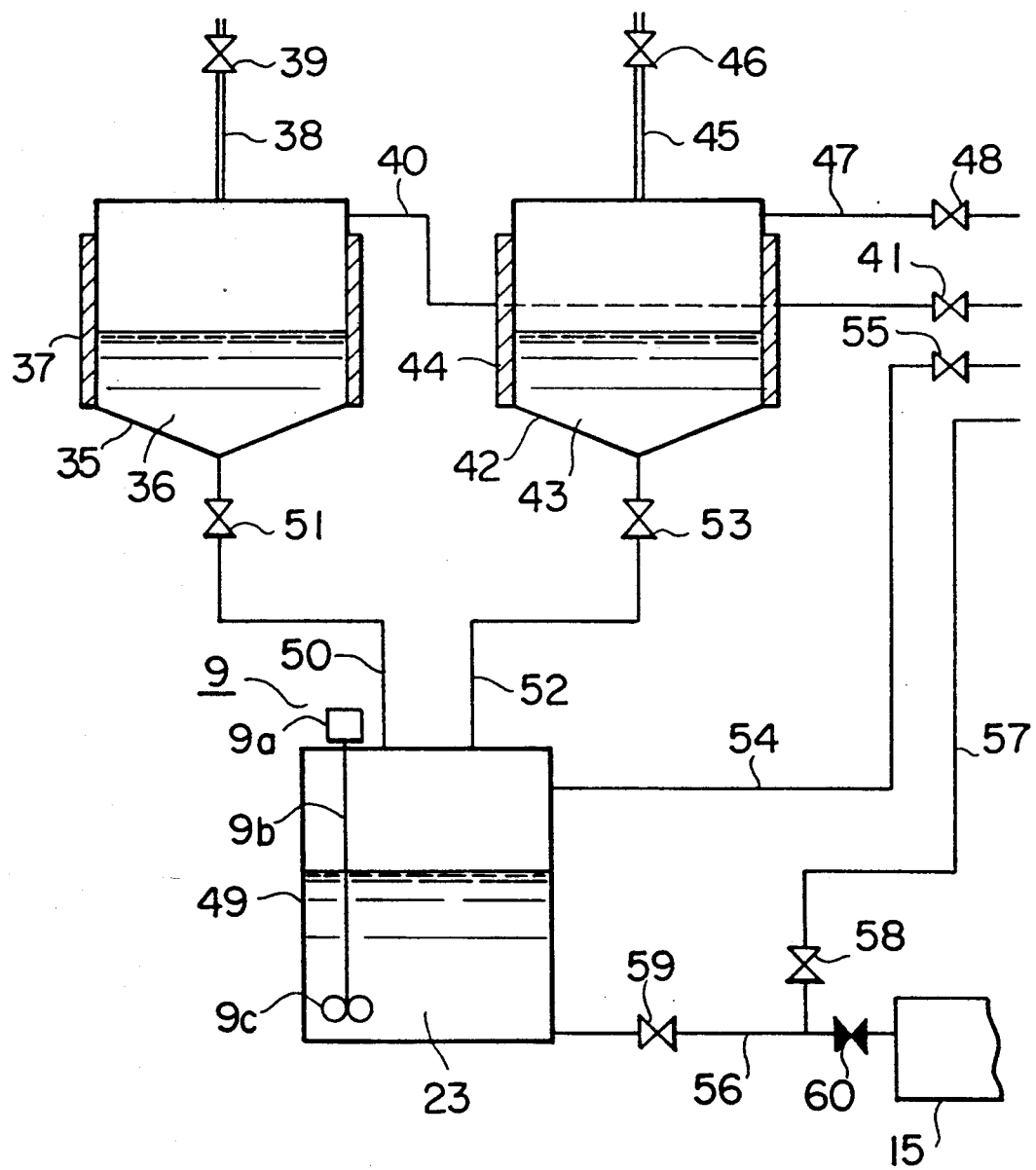
FIG. 20 is a schematic sectional view of a deaeration device according to the sixth aspect of this invention.

FIG. 20 shows a deaeration device for the cooling medium of a boiling cooling device, according to the sixth aspect of this invention. The device corresponds to that shown in FIG. 4, but comprises two deaeration baths 35 and 42 and a mixing bath 49. Reference numeral 15 represents a sealed container for accommodating a heat generating electric element such as power thyristors.

The first and second deaeration baths 35 and 42, for containing and deaerating water 36 and ethylene glycol 43, respectively, are each provided, at the top thereof, with an inlet pipe 38 and 45, and, at a side near the top thereof, an exhaust pipe 40 and 47. The inlet pipes 38 and 45 are provided with a valve 39 and 46, respectively, and the exhaust pipes 40 and 47 are provided with valves 41 and 48, respectively. Further, the deaeration baths 35 and 43 are each connected to the top of the mixing bath 49 via a connection pipe 50 and 52 coupled to the bottom of the baths 35 and 43 and provided with valves 51 and 53, respectively. The sides of the baths 35 and 43 are covered with a cooling shell 37 and a heating shell 44, respectively.

The mixing bath 49, for containing the mixed cooling medium 23 of predetermined content, is provided side near the top thereof with an exhaust pipe 54 having a valve 55, and is connected to the sealed container 15 via a sealing pipe 56 coupled to a side of the mixing bath 49 near the bottom thereof. The sealing pipe 56 is provided with two valves 59 and 60, and a branch pipe 57 having a valve 58 is coupled to the sealing pipe 56 between the valves 59 and 60. Further, the mixing bath 49 is provided with an agitator 9 comprising a motor 9a, a rotation shaft 9b, and agitation wings or spoons 9c.

The operation of the deaeration and sealing device of FIG. 20 is as follows.

First, the valves 51 and 53 of the connection pipes 50 and 52 are closed, and predetermined amounts of water 36 and ethylene glycol 43 are introduced into the deaeration baths 35 and 42, respectively, via the inlet pipes 38 and 45, respectively. Next, the valves 39 and 46 of the inlet pipes 38 and 45 are closed, and the cooler and the heater 37 and 45 are operated such that the cooler 37 is at about 5° C. while the heater 44 is at about 100° C. Thereafter, the exhaust valves 41 and 48 are opened so as to exhaust the interior of the deaeration baths 35 and 42, respectively. Thus, the water 36 and the ethylene glycol 43 are deaerated. After the deaeration is complete, the exhaust valves 41 and 48 are closed.

On the other hand, the interior of the sealed container (accomodating a heat generating electric device) 15 is exhausted by opening the valve 60 of the sealing pipe 56 and the valve 58 of the branch exhaust pipe 57, the valve 59 of the sealing pipe 56 being kept closed. Next, the interior of the mixing bath 49 is exhausted via the pipes 54 and 57 by opening the the valves 55 and 59, while the valve 60 of the sealing pipe 56 at the side of the container 15 is closed. After the mixing bath 49 is exhausted, the valves 55 and 59 are closed.

Next, the valves 51 and 53 of the connection pipes 50 and 52 are opened, so as to introduce from the deaeration baths 35 and 42, respectively, predetermined amounts of water 36 and ethylene glycol 43 into the mixing bath 49. For example, the ratio of the amount of water 36 and ethylene glycol 43 introduced into the mixing bath 49 should be 65:35, as has been noted above, if the resulting cooling medium 23 is to have a congealing or freezing point at about $-20°$ C. After this, the valves 51 and 53 are closed, and the cooling medium 23 comprising water and the ethylene glycol is agitated by the agitator so as to mix them completely.

Next, after the cooling medium 23 is cooled to near room temperature, the valves 59 and 60 of the sealing pipe 56 are opened while the valve 58 of the branch pipe 57 is closed, thereby introducing the mixed cooling medium 23 into the container 15. After a predetermined amount of cooling medium 23 is introduced into the container 15, the valve 60 is closed to shut off the sealing pipe 56.

In the device of FIG. 20, water 36 and the ethylene glycol 43 are deaerated separately by means of the respective deaeration baths 35 and 42 and are mixed to a predetermined ratio in the mixing bath 49. Thus, although the cooling medium 23 comprises two components (water and ethylene glycol in this case) having different boiling points, the ratio of the components of the cooling medium 23 can be maintained precisely at the predetermined level in spite of the complete deaeration thereof.

The sixth aspect of this invention can modified as desired. For example, the cooling medium may comprise three or more components, and, accordingly, the number of deaeration baths may be three or more. Alternatively, one deaeration bath may be utilized for successively deaerating a plurality of components of the coding medium, such that the deaerated components are introduced successively into the mixing bath 49. In such a case, it is necessary that the one deaeration bath be provided both with a cooler and a heater. Furthermore, the deaeration baths 35 and 42 may consist of a container having a transparent side wall provided with graduations such that the amount of water 36 and glycol 43 supplied to the mixing bath 49 may be measured precisely.

What is claimed is:

1. A boiling type cooling device comprising:
   an evaporator containing a cooling medium comprising water and an antifreeze liquid for lowering the freezing temperature of the cooling medium;
   a condenser for condensing vapor of the cooling medium generated in the evaporator;
   a vapor pipe connecting the evaporator to the condenser for transferring vapor of the cooling medium generated in the evaporator to the condenser;
   a first connecting pipe connecting the condenser to the evaporator for transporting liquid between the condenser and the evaporator;
   a second connecting pipe connecting the condenser to the evaporator for transporting liquid between the condenser and the evaporator; and
   driving means for circulating liquid from the condenser to the evaporator and back to the condenser through the first and second connecting pipes, the driving means comprising a magnetically operated pump having an impeller disposed inside the first connecting pipe and magnetic drive means disposed outside the first connecting pipe for driving the impeller by magnetic force through the first connecting pipe.

2. A boiling type cooling device as claimed in claim 1 wherein the cooling medium comprises an aqueous solution of ethylene glycol.

3. A boiling type cooling device as claimed in claim 1 wherein:
   the impeller comprises a magnetic support and a plurality of impeller blades secured to the support;
   the first connecting pipe includes bearing means for rotatably supporting the magnetic support inside the first connecting pipe.

4. A boiling type cooling device as claimed in claim 3 wherein:
   the magnetic support comprises a disc including a surface having a bearing recess, and
   the bearing means comprises a well formed in the first connecting pipe around the disc and having a support projection for engaging the bearing recess of the disc.

* * * * *